(12) United States Patent
Marquardt

(10) Patent No.: US 12,222,746 B2
(45) Date of Patent: Feb. 11, 2025

(54) MICROCONTROLLER AND METHOD FOR INITIALIZING A MICROCONTROLLER

(71) Applicant: Infineon Technologies AG, Neubiberg (DE)

(72) Inventor: Matthias Marquardt, Hannover (DE)

(73) Assignee: Infineon Technologies AG, Neubiberg (DE)

( * ) Notice: Subject to any disclaimer, the term of this patent is extended or adjusted under 35 U.S.C. 154(b) by 125 days.

(21) Appl. No.: 17/960,842

(22) Filed: Oct. 6, 2022

(65) Prior Publication Data

US 2023/0110860 A1    Apr. 13, 2023

(30) Foreign Application Priority Data

Oct. 12, 2021  (DE) .................... 10 2021 126 384.0

(51) Int. Cl.
*G06F 1/08* (2006.01)
*H03K 21/08* (2006.01)

(52) U.S. Cl.
CPC .............. *G06F 1/08* (2013.01); *H03K 21/08* (2013.01)

(58) Field of Classification Search
CPC .................................. G06F 1/08; H03K 21/08
See application file for complete search history.

(56) References Cited

U.S. PATENT DOCUMENTS

| | | | | |
|---|---|---|---|---|
| 5,381,085 A | * | 1/1995 | Fischer | G01R 31/316 327/159 |
| 2006/0059381 A1 | * | 3/2006 | Plourde | G06F 1/08 713/500 |
| 2017/0302285 A1 | * | 10/2017 | Niwa | H03B 5/36 |
| 2021/0083666 A1 | * | 3/2021 | Matalon | H03K 5/135 |

* cited by examiner

*Primary Examiner* — Phil K Nguyen
*Assistant Examiner* — Brian J Corcoran
(74) *Attorney, Agent, or Firm* — Eschweiler & Potashnik, LLC

(57) ABSTRACT

The disclosure provides a microcontroller which has an internal timing device for generating an internal clock signal, at least one terminal contact for receiving an external clock signal, a clock changing device and a timer module, which is electrically conductively connected to the at least one terminal contact and to the internal timing device and, after the microcontroller has been switched on, is set up to determine a frequency of the external clock signal by means of the clock signal, and to determine at least one parameter by means of which the clock changing device can be set up to change the external clock signal into a useful clock signal with a predefined frequency.

22 Claims, 4 Drawing Sheets

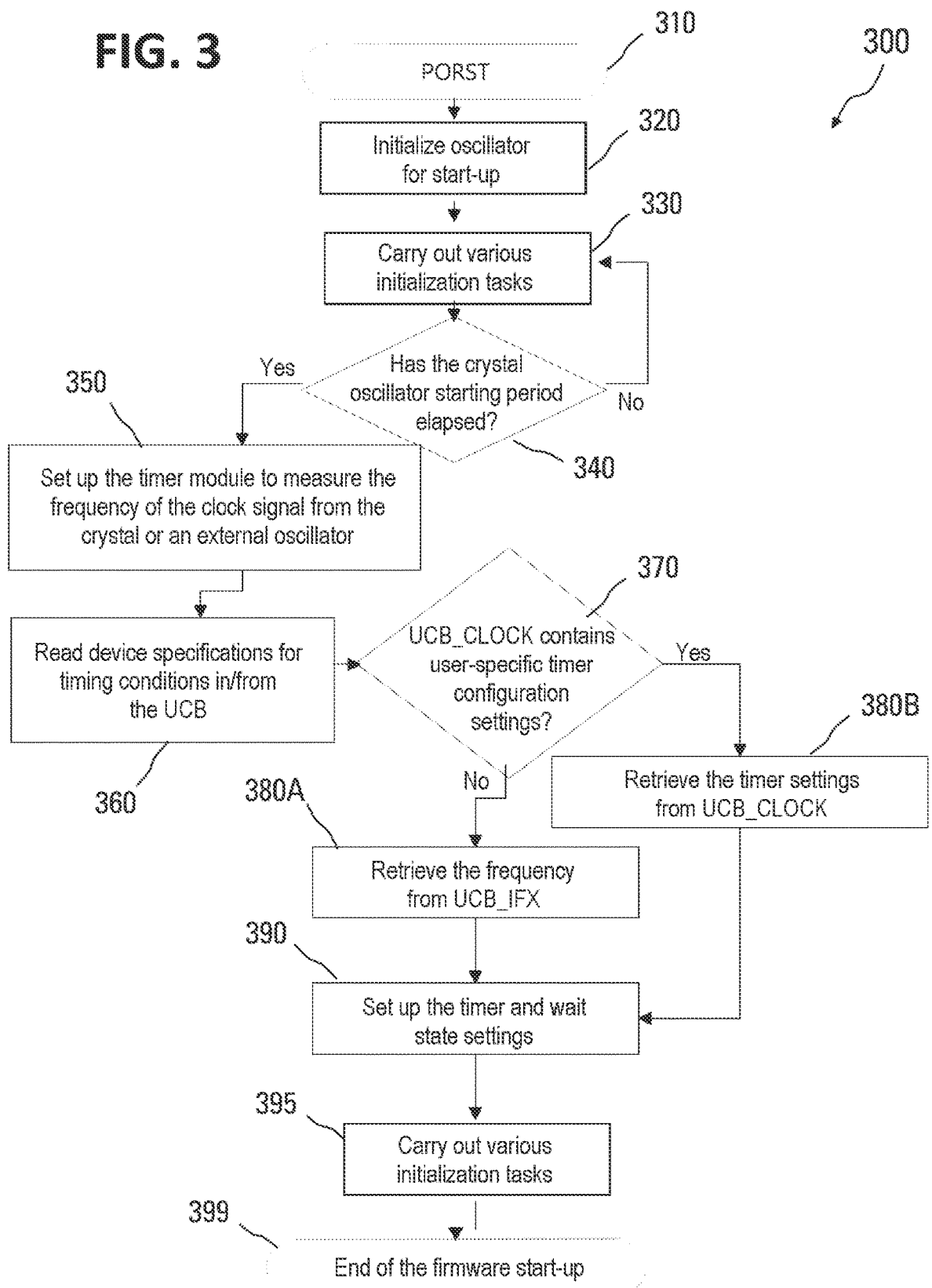

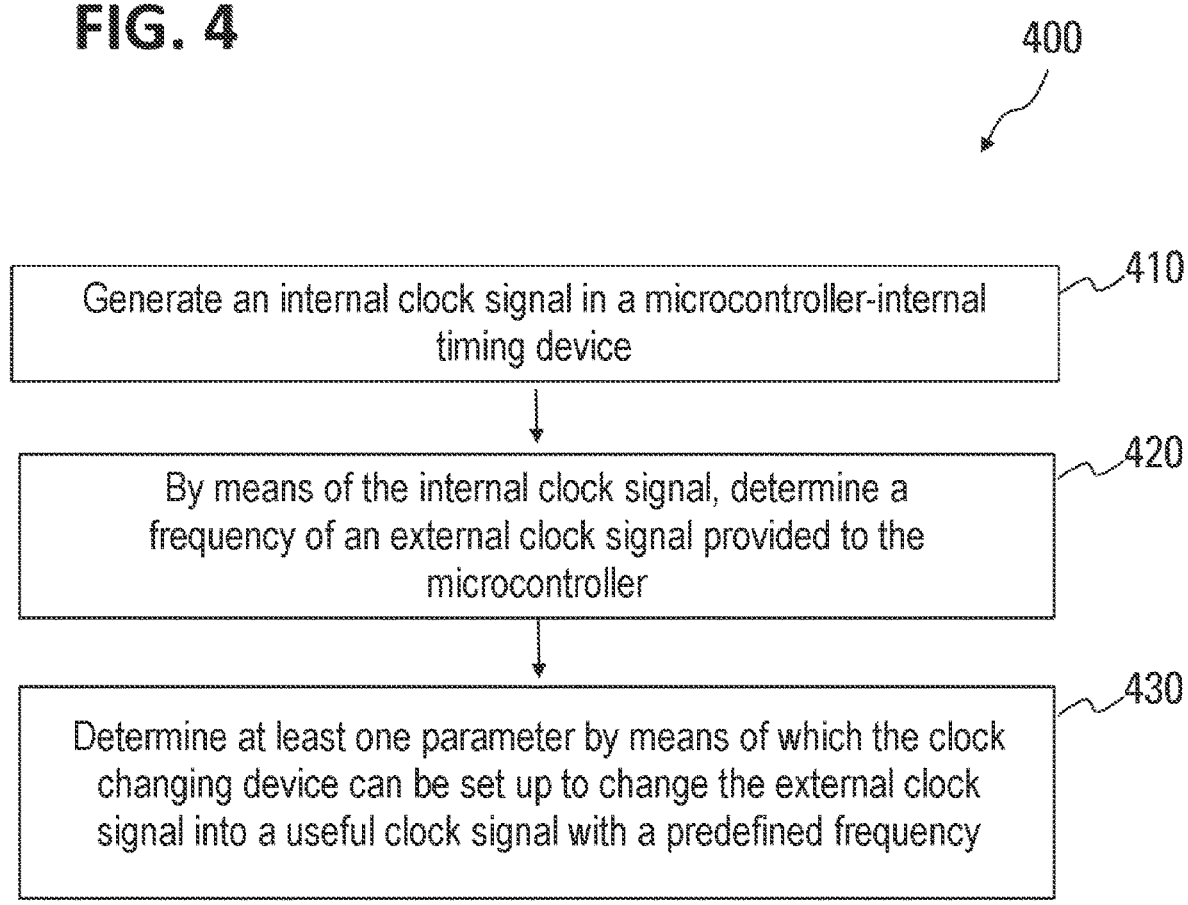

MICROCONTROLLER AND METHOD FOR INITIALIZING A MICROCONTROLLER

REFERENCE TO RELATED APPLICATIONS

This application claims priority to German Application 10 2021 126 384.0, filed on Oct. 12, 2021. The contents of the above-referenced Patent Application is hereby incorporated by reference in its entirety.

TECHNICAL FIELD

The disclosure relates to microcontroller and a method for initializing a microcontroller.

BACKGROUND

In a microcontroller, an external timing device, which feeds the microcontroller with an external clock signal, is typically provided by the user. Provision is made for the external clock signal to be changed in the microcontroller such that a useful clock signal with predetermined properties, in particular with a predetermined useful frequency, is provided.

A device for changing the external clock signal into a useful clock signal has to be set by the user with the knowledge of the external clock signal such that the useful clock signal with the predetermined properties is actually provided when the external clock signal is provided. The parameters to be provided for the setting depend on the frequency of the external clock signal and on the properties of the microcontroller.

This means that errors can occur during the setting of the device by the user, since the individual who performs the setting must not only study and understand the relevant documents but then also set the parameters matching the external clock signal for the generation of the desired useful clock signal at the correct points, as well as comply with the required programming sequences.

Errors during the setting of the parameters can lead to false timing and wait-state settings.

In various exemplary embodiments, a microcontroller is provided in which the error source, wrongly performing the setting of the useful clock signal and the wait states, is ruled out.

In various exemplary embodiments, the microcontroller can be set up to perform self-initialization of a timer (e.g. of a clock changing device) for providing the useful clock signal which is part of the microcontroller.

In various exemplary embodiments, the microcontroller can be set up to determine the frequency of the external clock signal and, on that basis, to determine at least one parameter which renders a clock changing device capable of providing a useful clock signal with a predefined frequency on the basis of the external clock signal, for example of changing the external clock signal to the useful clock signal with the predefined frequency, for example of scaling the external clock signal suitably.

To determine the frequency of the external clock signal (which, for example, can be provided by means of a quartz crystal or another suitable oscillator), in various exemplary embodiments an internal timing device, e.g. an internal oscillator, can be used.

The self-initialization can be carried out, for example, following switching on (so-called power-on reset (PORST)).

To determine the frequency of the external clock signal, in various exemplary embodiments use can be made of an internal clock signal, e.g. an internal oscillator.

In the event that an unauthorized/unsuitable frequency of the external clock signal is determined, the microcontroller can be set up to assume a locked mode, which permits further use of the microcontroller only when additional conditions have been fulfilled, for example following the processing of a complex procedure.

In various exemplary embodiments, the microcontroller can be set up either to measure or to determine, for example to calculate, all the data which is needed for any initialization of a timing system of the microcontroller (e.g. a clock changing device which generates a useful clock signal from a provided external clock signal), specifically irrespective of the connected external timing device (e.g. oscillator or crystal) or irrespective of the fact that the external timing device is provided with properties prescribed within narrow limits.

To determine the data which is needed for the initialization of the timing system, a configuration and a software code can be stored in a non-volatile memory (e.g., Read Only Memory (ROM)) by the manufacturer so that, when an application or a user software code is started, a maximum possible frequency of a useful signal can already be used.

BRIEF DESCRIPTION OF THE DRAWINGS

Exemplary embodiments of the disclosure are illustrated in the figures and will be explained in more detail below

FIG. 3 shows a flowchart of a method for initializing a microcontroller according to various exemplary embodiments; and FIG. 4 shows a flowchart of a method for initializing a microcontroller according to various exemplary embodiments.

DESCRIPTION

In the following extensive description, reference is made to the appended drawings, which form part of this description and in which, for the purposes of illustration, specific embodiments in which the disclosure can be carried out are shown. From this point of view, directional terminology such as "above", "below", "in front", "behind", "front", "rear", and so on is used with reference to the orientation of the figure(s) described. Since components of embodiments can be positioned in a number of different orientations, the directional terminology is used for illustration and is in no way restrictive. It goes without saying that other embodiments can be used and structural or logical changes can be made without departing from the protective scope of the present disclosure. It goes without saying that the features of the various exemplary embodiments described herein can be combined with one another, if not specifically otherwise stated. The following extensive description should therefore not be understood in the restrictive sense, and the protective scope of the present disclosure is defined by the appended claims.

Within the context of this description, the terms "connected", "attached" and "coupled" are used to describe both a direct and also an indirect connection, a direct or indirect attachment and a direct or indirect coupling. In the figures, identical or similar elements are provided with identical designations, if this is expedient.

Figure 1:
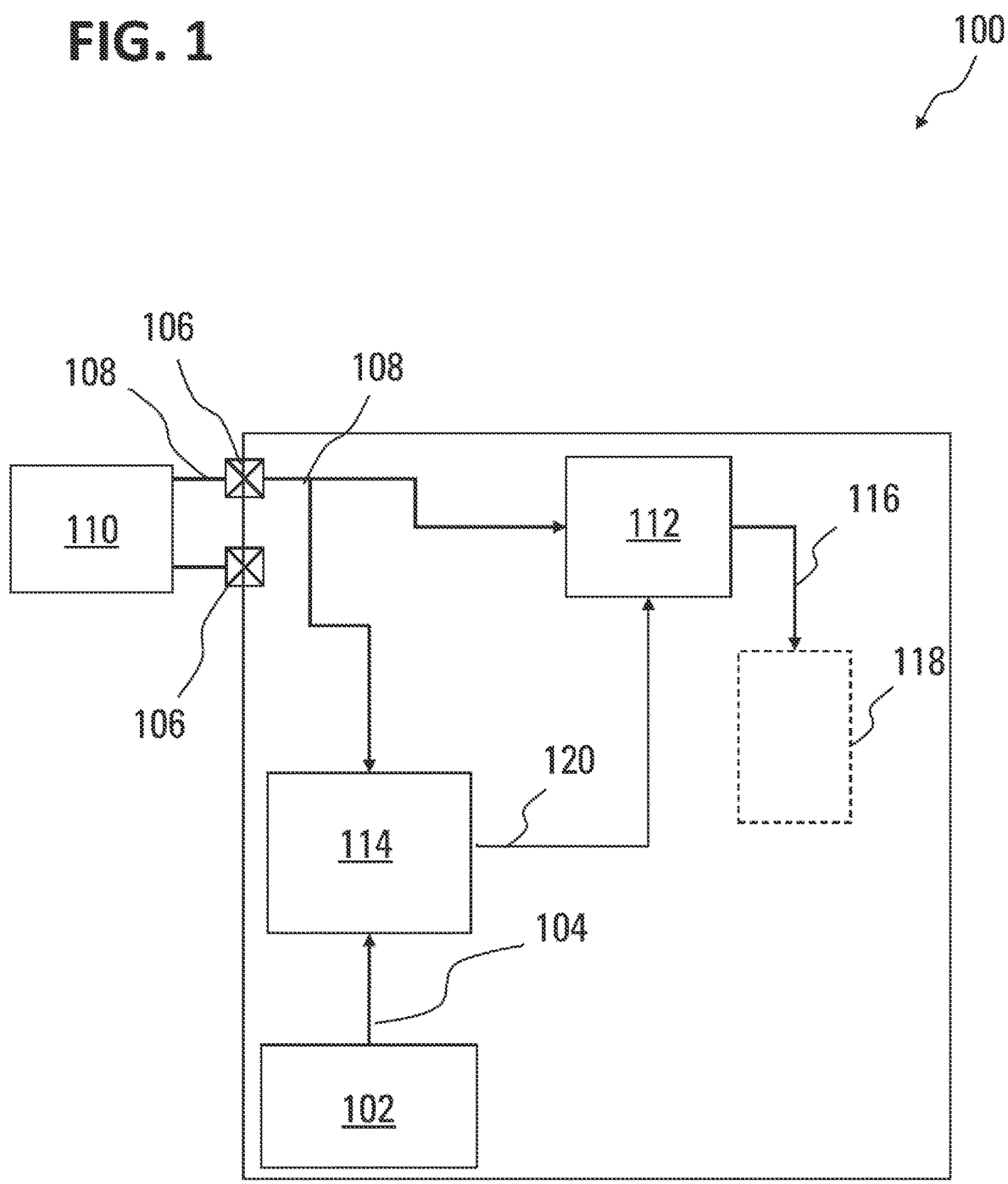
FIG. 1 shows a schematic illustration of a microcontroller according to various exemplary embodiments.
Figure 2:
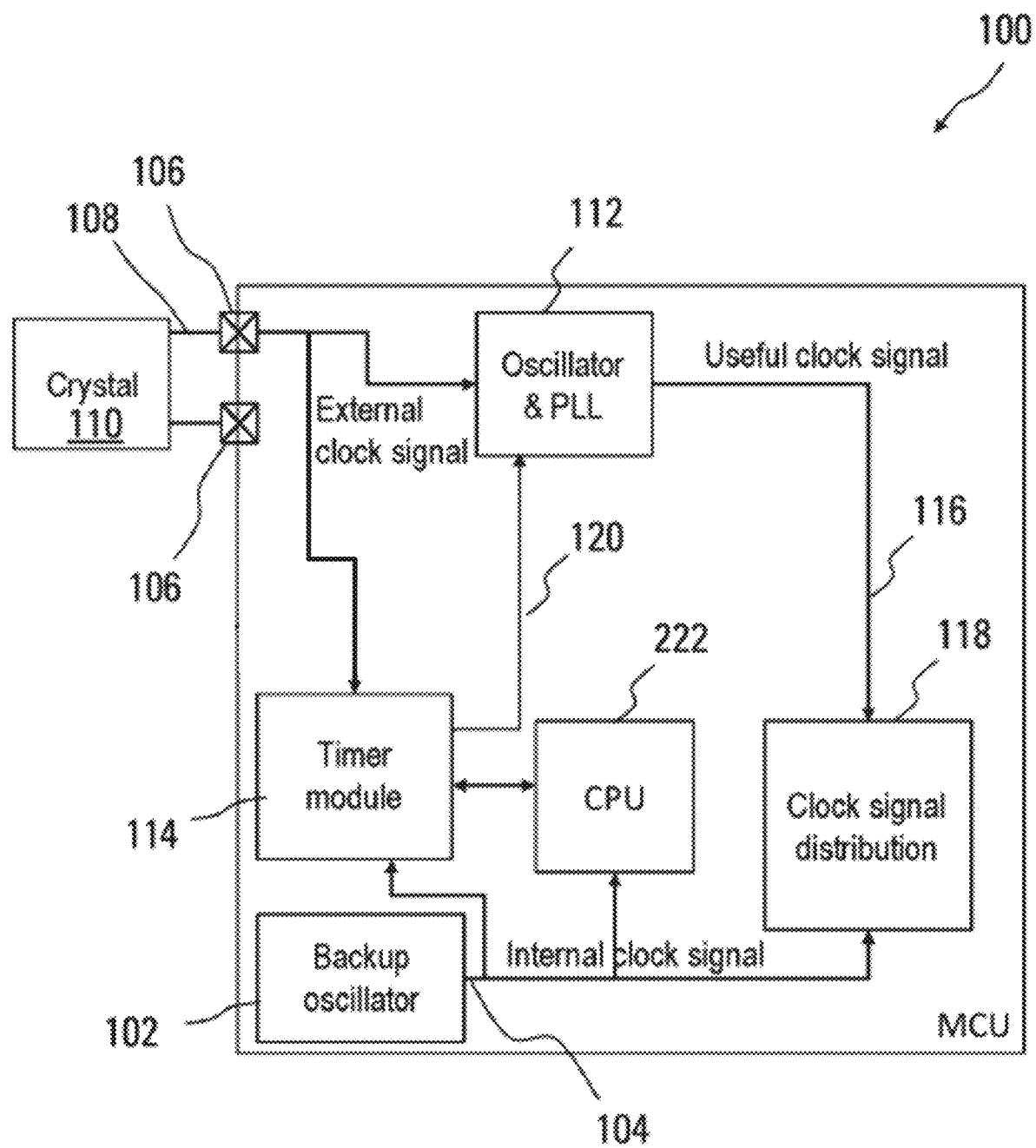
FIG. 2 shows a schematic illustration of a microcontroller according to various exemplary embodiments.

FIG. 1 and FIG. 2 each show a schematic illustration of a microcontroller 100 according to various exemplary embodiments. In the schematic illustrations, individual devices/circuits/elements of the microcontroller 100 and signals exchanged between them are illustrated. It should be understood that the devices/circuits/elements are coupled in a suitable way in order to transmit the signals, for example by means of appropriate electrically conductive connections.

Herein, various timing devices are described, which are typically also designated as a timing device or as a clock.

The microcontroller 100 can be set up to receive an external clock signal 108, for example from an external timing device 110 which, for example, can be formed as a crystal or as another oscillator device.

To receive the external clock signal 108, the microcontroller 100 can have at least one terminal contact 106, for example two terminal contacts 106, as illustrated in FIG. 1 and FIG. 2.

The microcontroller 100 can further have an internal timing device 102 for generating an internal clock signal 104. In various exemplary embodiments, the internal timing device 102 can expediently be formed (as indicated by way of example in FIG. 2) as a "backup oscillator". An internal timing device 102 with a backup oscillator function can be set up, for example, to provide an internal clock signal 104 (e.g. permanently), to which it is possible to resort in the event of failure of the useful clock signal (e.g. because of a missing external clock signal 108 and/or because of a fault in a clock changing device 112 (this is described in more detail below)). The internal clock signal 104 provided by the internal timing device 102 may typically be less precise and/or less stable in its properties than the external clock signal 108, so that it may be unsuitable as a useful clock signal for permanent regular operation of the microcontroller 100.

In various exemplary embodiments, the internal timing device 102 can be formed as an individual timing device—instead of as a backup oscillator or as an addition thereto.

In various exemplary embodiments, the microcontroller 100 also has a timer module 114. The timer module 114 can, for example, have software and hardware modules and on the one hand can be set up to carry out timer module tasks which are usual, for example receiving and characterizing the internal clock signal 104, providing a pulse width modulated signal, and so on. The timer module 114 can be set up to operate substantially independently of a (main) processor 222, e.g. a CPU 222, integrated in the microcontroller 100.

On the other hand, the timer module 114 can be set up to provide the additional functions (and possibly further functions) explained in more detail herein.

In various exemplary embodiments, the timer module 114 can be electrically conductively connected to the at least one terminal contact 106 and to the internal timing device 102. In particular, the electrically conductive (hardware) connection between an input of the timer module 114 and the at least one terminal contact 106 (accordingly at least one output of the external timing device 110) can be novel as compared with microcontrollers 100.

In various exemplary embodiments, the timer module 114 can be set up to determine a frequency of the external clock signal 108 after the microcontroller 100 has been switched on, for which purpose the timer module 114 can use the internal clock signal 104.

In various exemplary embodiments, the microcontroller 100 can further have a clock changing device 112. The clock changing device 112 can be connected (e.g. electrically conductively) to the at least one external terminal 106, for example to receive the external clock signal 108 from the external timing device 110.

The clock changing device 112 can be set up to change the external clock signal 108 such that it provides or can provide a useful clock signal 116 with predefined properties, in particular with at least a predefined frequency. The clock changing device 112 can, for example, have an oscillator, at least one clock divider, at least one phase-locked loop (PLL) and/or other and/or additional hardware and/or software elements, for example as known clock changing devices. In various exemplary embodiments, the at least one predefined frequency can be provided by the user, otherwise by the manufacturer. The at least one predefined frequency can, for example, have a (maximum) frequency at which, for example, a (main) processor 222 is to be operated during normal operation, and/or a frequency at which the main processor is to be operated in an energy-saving mode, and/or a frequency for operating peripheral devices. Furthermore, for example, an oversampling rate and/or further additional parameters can be provided and taken into account by the clock changing device 112 during the needs-based generation of the at least one useful clock signal 116.

In various exemplary embodiments, the useful clock signal 116 can be fed to an optional clock signal distribution device 118, which performs the distribution to devices and processes which need the useful clock signal 116.

The timer module 114 can be set up, on the basis of the determined frequency of the external clock signal, to determine at least one parameter 120 by means of which the clock changing device 112 can be set up to change the external clock signal 108 into the useful clock signal 116 with the predefined frequency. The timer module 114 can provide the at least one determined parameter 120 to the clock changing device 112.

The timer module 114 can be provided with all the parameters which it uses or needs to determine the at least one parameter 120 for setting up the clock changing device 112 while incorporating the determined frequency of the external clock signal.

One of the parameters which are provided to the timer module 114 can be a permissible range for the frequency of the external clock signal 108. The permissible frequency range can be provided, for example, by the manufacturer, for example as a lower limiting frequency and an upper limiting frequency or, for example, only as an upper limiting frequency.

In various exemplary embodiments, additional parameters can be, for example, permissible wait state configurations and/or the frequency of the useful clock signal 116. The frequency of the useful clock signal 116 can be retrieved from the timer module 114 or from the clock changing device 112.

The additional parameters, for example the permissible range, the permissible wait state configurations and/or the frequency of the useful clock signal 116 can, for example, be stored in at least one memory, for example in at least one ROM, e.g. a flash memory or another type of non-volatile memory, e.g. at least one register, for example in a "User Configuration Block", UCB, which can be written at the factory and/or by the user.

In the event of storage at the factory, the stored information can, if necessary, then be write-protected, so that a change by the user is prevented. In various exemplary embodiments, this may in particular be expedient for the permissible frequency range of the external clock signal 108. The provision of the permissible wait state configurations and/or the frequency of the useful clock signal 116 by the manufacturer and/or by the user may be expedient, depending on the application.

The timer module 114 can retrieve the stored permissible range, for example when the microcontroller 100 is started or after it has been started. On the basis of a result of a comparison of the determined frequency with the permissible range, the timer module 114 can either determine the at least one parameter 120 and provide it to the clock changing device 112 (if a determined frequency lies in the permissible range) or (if a determined frequency lies outside the permissible range, which, for example, is provided by an unsupported crystal), carry out a predefined action, for example interrupting the regular starting/start-up process of the microcontroller 100 and triggering a further start-up in a specific mode, for example a mode in which the internal clock signal 104 is used as a timer, a locked mode, which prevents both changes and also a further start-up and, for example, can be overcome only by means of replacing the external timing device 110 by a reliable timing device 110 and switching on/starting up again or another relatively complicated process, and/or outputting a warning to the user, or additional or other predefined actions.

Various exemplary embodiments thus permit a user to be provided with a microcontroller 100 which can be set up with less effort, so that development time (and therefore costs) can be saved.

Furthermore, according to various exemplary embodiments, a boot-up time of the microcontroller 100 can be reduced, since the useful clock signal 116 can already be provided before the microcontroller 100 has been started up completely, i.e. during the execution of starting software.

Furthermore, according to various exemplary embodiments, outlay for checking software implemented by the user in the microcontroller 100 can be reduced, since all the parameters which have to be provided by the user in order to generate the useful clock signal 116 in the clock changing device 112 are determined by the microcontroller 100 itself, apart from the result to be achieved (e.g. the target frequency of the useful clock signal 116).

According to various exemplary embodiments, an error rate of the microcontroller 100 is reduced, since fewer documents (or chapters) have to be read and understood and the microcontroller 100 is either operated with the maximum frequency that is possible for it or else (in the event that the external clock signal 108 is provided with an impermissible frequency) is even not operated at all.

The wait states can, for example, be set from the start (e.g. at the factory but possibly also by the user) such that they are designed for this maximum frequency.

Two of the main errors which are currently caused by the user during the operation of microcontrollers 100 can therefore be avoided, namely erroneous settings of the timing device(s) and erroneous settings of the wait states.

This additionally means that fewer requests for support and/or reports of damage, which would possibly cause a high outlay on determination and assistance, arise at the manufacturer.

Likewise, outlay on development and review by the user is reduced.

Clearly, preparation and progress of an initialization of a microcontroller 100 according to various exemplary embodiments can be described as follows.

1) Firstly, a suitable software function for executing the following initialization functions is added to start-up firmware of the microcontroller 100.
2) A hardware connection is produced within the microcontroller in order to connect a timer signal pin (the terminal contact 106) to an input of a timer module 114.
3) The timer module 114 can be used to measure the frequency of the external timing device 110 (e.g. the connected oscillator or crystal).
4) Maximum permitted specification settings (e.g. a maximum permissible frequency of the clock signal 108 provided by the external timing device 110) are read from a non-volatile memory in the microcontroller 100, in which they may have been stored by the manufacturer.
5) Envisaged settings, if present, are read from a non-volatile memory within the microcontroller 100, in which they may have been stored by the user. If no envisaged settings have been provided by the user, envisaged settings provided by the manufacturer can be used.
6) All the settings of the clock changing device 112 are calculated, for example, divider settings which are needed for the setting of the clock signal distribution and for the phase-locked loop(s).
7) The wait state configurations, which are needed for accesses to non-volatile memories, are calculated on the basis of information provided in a non-volatile memory by the manufacturer.
8) The wait states are initialized on the basis of the settings previously read.
9) The timing system (for example the clock changing device 112) is initialized with the calculated setting.

FIG. 3 shows a flowchart 300 of a method for initializing a microcontroller according to various exemplary embodiments.

The method can include switching on the microcontroller (also designated as "power-on reset", PORST) (310), initialization of an oscillator for starting up the microprocessor (320), execution of the various initialization tasks (330), a determination as to whether a crystal oscillator start-up period has elapsed (340), wherein the execution of the initialization tasks of 330 is repeated until the result from 340 states that the crystal oscillator start-up period has elapsed.

The timer module for measuring the frequency of the clock signal of the external crystal or an external oscillator is then set up (350), device specifications for timing conditions are read from a memory (e.g. from a "User Configuration Block", UCB) (360) and a check is made (370) as to whether the memory contains user-specific timer configuration settings (e.g. under UCB_CLOCK). If this is so, the timer settings are retrieved from UCB_CLOCK (380B). If this is not so, a frequency provided in the memory (e.g. in the UCB) is retrieved as the target frequency of a useful clock signal (380A).

Then, the timing and wait state settings are set up (390) and various initialization tasks are executed (395). This completes the firmware start-up (399).

FIG. 4 shows a flowchart 400 of a method for initializing a microcontroller according to various exemplary embodiments.

The method can include a generation of an internal clock signal in a microcontroller-internal timing device (410), a determination by means of the internal clock signal (420) of a frequency of an external clock signal provided to the microcontroller, and a determination of at least one parameter by means of which the clock changing device can be set up to change the external clock signal into a useful clock signal with a predefined frequency (430).

Some exemplary embodiments are specified in summary below.

Exemplary embodiment 1 is a microcontroller which has an internal timing device for generating an internal clock signal, at least one terminal contact for receiving an external clock signal, a clock changing device and a timer module, which is electrically conductively connected to the at least one terminal contact and to the internal timing device and, after the microcontroller has been switched on, is set up to determine a frequency of the external clock signal by means of the clock signal, and to determine at least one parameter by means of which the clock changing device can be set up to change the external clock signal into at least one useful clock signal with a predefined frequency.

Exemplary embodiment 2 is a microcontroller according to exemplary embodiment 1, wherein the timer module is also set up to determine a permissibility of the frequency and, in the event of determining that the frequency is impermissible, to interrupt the starting process of the microcontroller.

Exemplary embodiment 3 is a microcontroller according to exemplary embodiments 1 or 2 which also has at least one storage device.

Exemplary embodiment 4 is a microcontroller according to exemplary embodiment 3, wherein the storage device is a non-volatile storage device.

Exemplary embodiment 5 is a microcontroller according to exemplary embodiment 3 or 4, wherein the timer module is also set up to store the at least one parameter in the at least one storage device.

Exemplary embodiment 6 is a microcontroller according to one of exemplary embodiments 3 to 5, wherein at least one permissibility parameter for the determination of the permissibility of the frequency is stored in the at least one storage device, for example by the manufacturer.

Exemplary embodiment 7 is a microcontroller according to one of exemplary embodiments 3 to 6, wherein the predefined frequency is stored in the at least one storage device, for example by the user.

Exemplary embodiment 8 is a microcontroller according to one of exemplary embodiments 1 to 7 which also has at least one main processor.

Exemplary embodiment 9 is a microcontroller according to exemplary embodiment 8 which is set up to generate the useful clock signal after the determination of the at least one parameter and to provide the useful clock signal to the main processor.

Exemplary embodiment 10 is a microcontroller according to one of exemplary embodiments 1 to 9, wherein the at least one parameter includes a clock divider parameter.

Exemplary embodiment 11 is a microcontroller according to one of exemplary embodiments 1 to 10, which is also set up to configure a phase-locked loop and/or a wait state on the basis of the at least one parameter.

Exemplary embodiment 12 is a method for initializing a microcontroller. The method includes generating an internal clock signal in a microcontroller-internal timing device, by means of the internal clock signal, determining the frequency of an external clock signal provided to the microcontroller and determining at least one parameter by means of which the clock changing device can be set up to change the external clock signal into a useful clock signal with a predefined frequency.

Exemplary embodiment 13 is a method according to exemplary embodiment 12, which also includes determining a permissibility of the frequency and, in the event of determining that the frequency is impermissible, interrupting a starting process of the microcontroller.

Exemplary embodiment 14 is a method according to exemplary embodiment 12 or 13 which also includes at least one storage device.

Exemplary embodiment 15 is a method according to exemplary embodiment 14, wherein the storage device is a non-volatile storage device.

Exemplary embodiment 16 is a method according to exemplary embodiment 14 or 15 which also includes storing the at least one parameter in the at least one storage device.

Exemplary embodiment 17 is a method according to one of exemplary embodiments 14 to 16 which also includes storing at least one permissibility parameter for the determination of the permissibility of the frequency in the at least one storage device, for example by the manufacturer.

Exemplary embodiment 18 is a method according to one of exemplary embodiments 14 to 17 which also includes storing the predefined frequency in the at least one storage device, for example by the user.

Exemplary embodiment 19 is a method according to one of exemplary embodiments 12 to 18, wherein the microcontroller also has at least one main processor.

Exemplary embodiment 20 is a method according to exemplary embodiment 19 which also includes generating the useful clock signal and providing the useful clock signal to the main processor following the determination of the at least one parameter.

Exemplary embodiment 21 is a method according to one of exemplary embodiments 12 to 20, wherein the at least one parameter includes a clock divider parameter.

Exemplary embodiment 22 is a method according to one of exemplary embodiments 12 to 21, which also includes configuring a phase-locked loop and/or a wait state on the basis of the at least one parameter.

Further advantageous refinements of the device can be gathered from the description of the method and vice versa.

What is claimed is:

1. A microcontroller, comprising:
    an internal timing hardware circuit having an output and configured to generate an internal clock signal;
    terminal contact configured to receive an external clock signal;
    a clock changing hardware circuit having a first input, a second input, and an output, the first input of the clock changing hardware circuit electrically connected to the terminal contact; and
    a timer hardware circuit having a first input, a second input, and an output, the first input of the timer hardware circuit electrically connected to the terminal contact, the second input of the timer hardware circuit independent of the first input of the timer hardware circuit and electrically connected to the output of the internal timing hardware circuit, and the output of the timer hardware circuit electrically connected to the second input of the clock changing hardware circuit;
    wherein the timer hardware circuit, after the microcontroller has been switched on, is configured to:
    determine a frequency of the external clock signal based on the internal clock signal, and
    determine at least one parameter based on which the clock changing device is configured to change the external clock signal into a useful clock signal with a predefined frequency.

2. The microcontroller as claimed in claim 1, wherein the timer hardware circuit is further configured to determine a permissibility of the frequency and, when the frequency is impermissible, to interrupt a starting process of the microcontroller.

3. The microcontroller as claimed in claim 1, further comprising:
at least one storage hardware circuit, wherein the storage hardware circuit is a non-volatile storage hardware circuit.

4. The microcontroller as claimed in claim 3, wherein the timer hardware circuit is configured to store the at least one parameter in the at least one storage hardware circuit.

5. The microcontroller as claimed in claim 3, wherein at least one permissibility parameter for the determination of the permissibility of the frequency is stored in the at least one storage hardware circuit.

6. The microcontroller of claim 3, wherein the predefined frequency is stored in the at least one storage hardware circuit.

7. The microcontroller of claim 1, further comprising:
at least one main processor,
wherein the microcontroller is configured to generate the useful clock signal after the determination of the at least one parameter and to provide the useful clock signal to the main processor.

8. The microcontroller of claim 1, wherein the at least one parameter includes a clock divider parameter.

9. The microcontroller of claim 1, the microcontroller being further configured to configure a phase-locked loop and/or a wait state based on the at least one parameter.

10. The microcontroller of claim 2:
wherein, when the frequency is determined to be permissible, the timer hardware circuit is configured to determine the at least one parameter and provide the at least one parameter to the clock changing hardware circuit, and
wherein, when the frequency is determined to be impermissible, the timer hardware circuit is configured to interrupt a start-up process of the microcontroller in a first mode and trigger a further startup of the microcontroller in a second mode that differs from the first mode.

11. The microcontroller of claim 10:
wherein the second mode is a mode in which the internal clock signal is used as a timer,
wherein the second mode is a locked mode which prevents changes and prevents a further start-up and which can only be overcome by replacing an external timing device configured to provide the external clock signal; or
wherein the second mode outputs a warning.

12. A method for initializing a microcontroller, comprising:
generating an internal clock signal in a microcontroller-internal timing hardware circuit;
based on the internal clock signal, determining a frequency of an external clock signal provided to the microcontroller;
determining whether the frequency of the external clock signal falls within a permissible frequency range;
wherein, when the frequency is determined to be within the permissible frequency range, determining at least one parameter and using the at least one parameter in a clock changing hardware circuit to change the external clock signal into a useful clock signal with a predefined frequency; and
wherein, when the frequency is determined to be outside of the permissible frequency range, interrupting a start-up process of the microcontroller in a first mode and triggering a further startup of the microcontroller in a second mode that differs from the first mode;
wherein the second mode is a mode in which the internal clock signal is used as a timer, or is a locked mode which prevents changes and prevents a further start-up and which can only be overcome by replacing an external timing device configured to provide the external clock signal; or is a mode that outputs a warning.

13. The method of claim 12, further comprising:
storing the at least one parameter in at least one storage hardware circuit.

14. The method of claim 13, further comprising:
storing the predefined frequency in the at least one storage hardware circuit.

15. The method of claim 12, further comprising:
at least one main processor in the microcontroller.

16. The method of claim 15, further comprising:
generating the useful clock signal and providing the useful clock signal to the main processor following the determination of the at least one parameter.

17. The method of claim 12, wherein the at least one parameter includes a clock divider parameter.

18. The method of claim 12, further comprising:
configuring a phase-locked loop and/or a wait state based on the at least one parameter.

19. A microcontroller, comprising:
a terminal contact configured to receive an external clock signal having a first stability and/or a first precision;
an internal timing hardware circuit having an output and configured to generate an internal clock signal having a second stability and/or a second precision, the second stability and/or the second precision being less than the first stability and/or the first precision, respectively;
a timer hardware circuit having a first input, a second input, and an output, the first input of the timer hardware circuit electrically connected to the terminal contact, the second input of the timer hardware circuit independent of the first input of the timer hardware circuit and electrically connected to the output of the internal timing hardware circuit; and
a clock changing hardware circuit having a first input, a second input, and an output, the first input of the clock changing hardware circuit coupled to the terminal contact, the second input of the clock changing hardware circuit coupled to the output of the timer hardware circuit.

20. The microcontroller of claim 19, further comprising:
a main processor coupled to the timing hardware circuit and the internal timing hardware circuit, wherein the timer hardware circuit is configured to be setup and operated substantially independent of the main processor.

21. The microcontroller of claim 19, wherein the clock changing hardware circuit includes a clock divider and a phase-locked loop.

22. The microcontroller of claim 19, further comprising:
non-volatile memory configured to store a permissible frequency range for the external clock signal;
wherein the timer hardware circuit is configured to determine a frequency of the external clock signal and further configured to compare the frequency of the external clock signal to the permissible frequency range;
wherein, when the frequency is within the permissible frequency range, the timer hardware circuit is configured to provide a parameter to the clock changing circuit to provide a usable clock signal based on the external clock signal at the output of the clock changing hardware circuit, and wherein, when the frequency is outside of the permissible frequency range, the timer hardware circuit is configured to interrupt a start-up process of the microcontroller to trigger a further start-up in which the internal clock signal is used as a timer.

* * * * *